Nov. 5, 1963

Re. 25,473

W. G. PFANN
SEMICONDUCTOR TRANSLATORS CONTAINING
ENCLOSED ACTIVE JUNCTIONS
Original Filed Dec. 16, 1954

INVENTOR
W. G. PFANN

BY George S. Sadig
ATTORNEY

United States Patent Office

Re. 25,473
Reissued Nov. 5, 1963

25,473

SEMICONDUCTOR TRANSLATORS CONTAINING ENCLOSED ACTIVE JUNCTIONS

William G. Pfann, Far Hills, N.J., assignor to Bell Telephone Laboratories, Incorporated, New York, N.Y., a corporation of New York Original No. 2,770,761, dated Nov. 13, 1956, Ser. No. 475,709, Dec. 16, 1954. Application for reissue Nov. 13, 1958, Ser. No. 773,802
20 Claims. (Cl. 317—235)

Matter enclosed in heavy brackets [ ] appears in the original patent but forms no part of this reissue specification; matter printed in italics indicates the additions made by reissue.

This application is a continuation-in-part of my copending application Serial No. 438,891, filed June 24, 1954. The invention herein described and claimed relates to semiconductor translating devices containing active p-n junctions enclosed within single crystals or other bodies of semiconductor material.

Devices constructed in accordance with the teachings of this invention have many desirable characteristics: enclosure of active junctions obviates instability due to amtospheric effects, efficiency is improved by the avoidance of surface recombination of carriers, base resistance and collector capacitance may both be minimized, cut-off frequency is increased and requirements of mechanical sturdiness may be considered virtually independently of electrical characteristics.

From a manufacturing standpoint, simplicity of apparatus, ease of making non-critical base contact in transistors and the removal of emphasis on increasingly smaller cross-sectional areas are all favorable.

The devices of this invention may be constructed of any material showing extrinsic semiconductor properties as, for example, materials whose electrical properties are at least in part due to the amount and kind of significant impurity dissolved therein such as germanium or silicon containing small amounts of an element or elements of Group III or V of the Periodic Table according to Mendelyeev.

Since, in many of the devices described, the active translator portion constitutes only a relatively small internal section of the entirety, the thickness of this active section is not limited by the usual considerations as to mechanical rigidity. It is, therefore, possible to present an active cross-section which is extremely small as compared with devices known to the art. One noteworthy effect of such reduced cross-section is a corresponding increase in cut-off frequency.

Special devices which are made possible by the present invention include an internal junction phototransducer in which surface photo-effects are transmitted through a substantial thickness of semiconductor which may be many times as great as a diffusion length of generated minority carrier.

"Temperature gradient zone-melting" to which process most of the described devices owe their practical existence, is described and claimed in my copending parent application to which reference is made above. In such a process a molten region is formed in or in contact with a body of semiconductor material, for example, by depositing on the semiconductor material a layer of an alloying material which lowers the melting point of the semiconductor material and heating until a molten region is formed. Maintaining the body within a temperature gradient with the molten region at the low temperature end, which nevertheless is hot enough to keep it molten, results in the region's traveling through the body to the high temperature end of the gradient. The electrical properties of the portion of the body traversed by the molten region are altered by virture of a distribution or redistribution of minor ingredients originally in the body or introduced by the molten region either as the alloying material or as a third ingredient.

As has been indicated, regions of high or low p-type or n-type conductivity may be produced in germanium, silicon or their alloys by including significant impurities in the temperature gradient zone. Examples follow:

1. About 0.1 percent or more of aluminum, gallium, boron, or indium is effective in producing a high conductivity p-type swept region.
2. Where it is desired to produce a low conductivity p-type region, lesser amounts of any of the acceptor materials listed in paragraph 1 in a carrier material may be utilized, 0.1 percent or less of the acceptor material being effective. Carrier materials include tin, lead, and platinum. Other acceptor materials usable in the production of a low conductivity p-type region include gold, copper and zinc.
3. Phosphorus, arsenic, antimony, bismuth, and lithium either in pure form or alloyed in carrier materials such as those listed in paragraph 2, are usable in the production of high conductivity n-type regions. Depending on the conductivity desired, concentrations of about 0.1 percent or higher are indicated.
4. Amounts of 0.1 percent or less of any of the materials listed in paragraph 3 in the zone material is effective in the production of low conductivity n-type regions.

Depending on the shape of the molten region the zone is known as a "dot" zone, a "line" or "wire" zone or an "area" zone.

It will be seen that substantially all of the devices described may be manufactured by the exclusive use of temperature gradient zone-melting techniques. It will also be seen that other semiconductor processes known to the art may also be utilized. Some of these processes as adapted to the manufacture of the devices of this invention are described. It will be seen that although, in every device described, substantially all of the operations may be carried out by the use of temperature gradient zone-melting, it is frequently advantageous from a manufacturing standpoint to utilize some one of the other process set forth in selected operations.

Since the effects gained by the use of various of the common semiconductor processes under given conditions of temperature, pressure, composition and time in their application to common semiconductor materials are known, the person skilled in the art will frequently resort to the use of these processes where certain junction characteristics are desired. Such techniques include crystal pulling, rate growing, alloying, diffusion and electroplating.

In the description of this invention, certain assumptions, justified in view of the state of the semi-conductor art, will be made. For example, it is to be understood that although specific examples and figures are set forth in terms of definite p- and n-type conductivity regions, the types of these regions may be interchanged without affecting operation assuming corresponding circuit changes are made. Although for the sake of convenience much of the description will be in terms of specific semiconductor materials, it is to be understood that these specific materials are illustrative only. There are known to persons skilled in the art numerous semiconductor materials, the properties of which may be controlled by the described processes.

It is to be understood that although the semiconductive properties may be discussed in terms of impurity concentrations, the devices described and claimed will operate equally well whether present theory ascribes the conduction properties to actual matter concentration, crystal-line imperfections or any other carrier source whatsoever.

The use of the symbol "I" denotes intrinsic semiconductor material, that is, semiconductor material in which the numbers of free electrons and holes are equal.

In general, in the discussion relating to internal junction devices, only those properties which are markedly affected by the new design will be discussed. This is premised on the assumption that the rectifier and transistor art is sufficiently understood so that the design criteria common to the devices herein described and devices of the prior art are known to those skilled in the art. Such criteria which include acceptable resistivity levels and the interdependence of various properties of the materials, such as carrier lifetimes, mobilties, etc., are set forth in many publications; see for example "Electrons and Holes in Semiconductors" by William Shockley.

In the description of this invention use will be made of both the lower case symbols p and n and the upper case symbols P and N. Where both upper and lower case symbols are utilized in the description of a single device, the upper case symbols indicate regions of higher conductivity, that is, lower resistivity, than do the lower case symbols. In general, in the description of a single device, the upper case symbol indicates a conductivity at least ten times greater than that of the region represented by the lower case symbol. Although the restriction is not common, for the purpose of this description, the lower case symbols have reference, in general, to material of a resistivity of from approximately 30-ohm centimeter to 1/10-ohm centimeter with the preferred range running upwards of 1/2-ohm centimeter. By this definition, therefore, the resistivity of a region indicated by an upper case symbol will generally be of the order of 1/10 of an ohm centimeter or lower. The other symbols to which reference is had will be defined as the description proceeds.

In order to better teach the invention, reference will now be had to the accompanying drawing in which.

Figure 1:
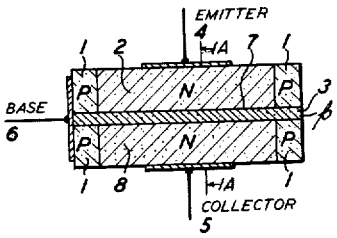
FIG. 1 is a cross-sectional view of an n-p-n transistor in which the active junctions are enclosed within high conductivity regions.
Figure 1A:
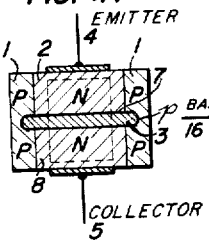
FIG. 1A is a cross-sectional view through FIG. 1.

Referring again to FIG. 1 the device depicted may be regarded as a longitudinal section of a cylinder or prism so that P regions 1 may all be regarded as part of the same P region. P region 1 may be made by diffusing an acceptor such as boron, aluminum, gallium or indium into an N-type block of germanium, silicon, or other semiconductor material. Alternatively, it may be made by temperature gradient zone-melting, by passing a ring-shaped P-producing zone vertically through an N block or by the passage of an N-producing area, line or dot zone vertically through a P-type block in the manner described above and in accordance with the disclosure contained in my above-designated parent application. According to the method of manufacture used, therefore, N-type regions 2 and 8 may be the conductivity type of the original material or may be produced as described. The critical p region 3 may be made by sweeping a p-producing wire-zone horizontally through the P and N block by temperature gradient zone-melting. The resultant device comprises cylindrical N regions 2 and 8 enclosed at their extremities by P region 1 and separated into two parts by thin p-type layer 3. The transistor structure is completed by the connection of emitter electrode 4, collector electrode 5, and base electrode 6. Base electrode 6 may be soldered to any portion of the P-p-P region. For lowest base resistance $r_b$ a ring connection covering most of the exposed P-type surface of region 1 is desirable.

In the device shown in FIG. 1 each junction is complex being part PN and part pN. At the emitter junction 7 it is evident that under forward bias, that is, emitter N region negative in respect to p region 3 and P regions 1, which regions are connected in parallel electron current intensity will be greater at the pN region than at the PN region. This is explained in the following manner: In a p-n junction the lower the conductivity of a region the greater will be the flow of minority carriers under forward bias (W. Shockley, "Electrons and Holes in Semiconductors," pages 309–316) and the lower the diffusion-length of minority carriers in a region the greater will be the forward current of minority carriers. The thin p layer 3 constitutes a shorter diffusion-length than the thicker P regions 1, assuming comparable lifetimes in the two regions. For this reason, the emitter gamma can be much larger than the ratio of pN area to PN area and may in fact closely approach unity. For high gamma the P region thickness should be a minimum of one diffusion-length, so as to minimize the flow of electrons into the P region.

Emitter gamma is defined as $I_m/I_e$ where $I_m$=forward minority carrier current through emitter junction (electron flow for P-type base region)

$I_e$=total forward current through emitter junction, which is comprised of a current of electrons flowing from the N region to the (P+p) region, and a current of holes flowing from the (P+p) region to the N region.

The n-p-n transistor of FIG. 1 has the following features:

1. Floating emitter potential caused by surface leakage current from the reverse biased collector region 8 to the emitter region 2 is obviated because the surface path between p-n junctions is long. The advantage of a planar base layer geometry is, however, retained.

2. The possibility of loss of injected carriers by surface recombination is almost entirely eliminated because most of the electron current from the emitter region 2 flows inside the block at pN junction 7.

3. The P region constitutes a base connection providing a very low positive feedback resistance $r_b$ which is desirable for electrical stability and high frequency operation. From a manufacturing standpoint, the comparatively large area to which base contact may be made is advantageous.

4. The PN junction area in the device depicted increases the total junction area and consequently increases the junction capacitance which tends to impair cut-off frequency. However, if the PN junction area is kept to a minimum by etching or otherwise, the total pN plus PN area may be no larger than the active junction area in a conventional transistor so that there is no increase in junction capacitance. Increased capacitance may be mitigated in whole or in part by the reduction in base resistance and may be further reduced by biasing the p region, for example in the manner described in connection with FIG. 4. An alternate method of improving the high frequency cut-off of the device depicted is by the utilization of a graded junction in accordance with the disclosure set forth in my copending application Serial No. 465,376, filed October 28, 1954. Such a graded junction, although it does not reduce the effective junction area as does the biasing arrangement shown in FIG. 4, has the effect of imposing a field across the junction from the emitter to the collector, thereby restricting carrier flow, so that the transit times of minority carriers are decreased, thereby increasing the frequency response.

Figure 2:
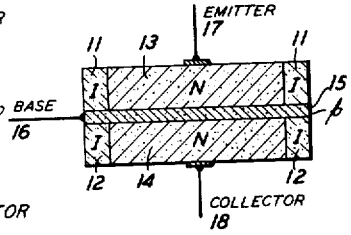
FIG. 2 is a cross-sectional view of a device similar to that shown in FIG. 1 in which, however, the active junctions are enclosed within intrinsic material.

The device of FIG. 2, comprising intrinsic or I regions 11 and 12, N regions 13 and 14, p layer 15, base electrode 16, emitter electrode 17 and collector electrode 18 is, in operation, similar to the device of FIG. 1. This device may be constructed in the following manner: Starting with a block of intrinsic material a temperature gradient area zone containing donor material is caused to traverse the block from one surface to the other so as to produce a high conductivity N-type region 13—14 after which a line zone producing a low conductivity p-type layer is swept across the high conductivity N-type region so as to produce p region 15 thereby dividing the high conductivity N-type region into N regions 13 and 14.

While the electron current across the NI emitter junction of the device of FIG. 2 is greater than that across the NP junction of the device of FIG. 1, so that gamma is reduced, an NI junction has lower capacity and lower surface leakage than an NP junction, both of which are desirable at the collector and both of which arise from the wider space-charge region of such a junction under reverse bias.

Figure 3:
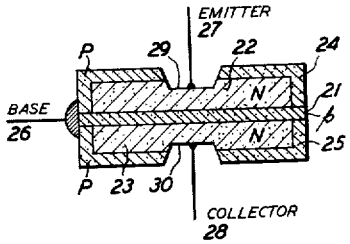
FIG. 3 is a cross-sectional view of an enclosed triode structure alternative to that shown in FIGS. 1 and 2.

By use of the device depicted in FIG. 3 the effects of surface conditions on the reverse collector current $I_{co}$ may be minimized. Such a device consisting of p layer 21, N regions 22 and 23, P regions 24 and 25, base electrode 26, emitter electrode 27 and collector electrode 28 may be manufactured in the following manner: P layer 24—25 may be made, for example, by diffusion so as to enclose an N-type block after which p layer 21 is created by temperature gradient zone-melting. Gaps 29 and 30 are etched through P layers 24 and 25 so as to expose N regions 24 and 25 to which regions fine wires are bonded so as to form emitter electrode 27 and collector electrode 28. A base connection 26 is then made in the manner described in connection with FIG. 1. Although this type of structure results in some increase in collector and emitter capacitances, greatly improved stability due to relative independence of ambient effects is realized.

Enclosure of active regions by inactive regions of semiconductor material has the salutary effect of protecting the active junctions from variations in illumination or other radiation which might affect operating currents. Opaque coatings have been used for this purpose but are disadvantageous in that they may impair alpha or $I_{co}$, the reverse collector current at zero emitter current. For this purpose, the enclosing layer 24—25 should be at least one diffusion-length in thickness.

It has been recognized for some time that a serious obstacle to the adaptation of the junction transistor to many circuits, to which their low power consumption, very small size and low operating temperature makes them admirably suited, is the comparatively low frequency cut-off of the n-p-n device. Recognizing that this frequency limitation is in large part due to the area of the base region in a plane perpendicular to minority carrier flow within this region, R. L. Wallace, Jr. in United States Patent 2,657,360 discloses and claims a tetrode device in which an additional electrode makes contact to the base region and is suitably biased in respect to the base electrode so as to confine carrier flow to only a portion of the cross-section of base region. The effective decrease in cross-sectional area of the base region greatly improves the frequency response of the device. An enclosed junction device operating on the tetrode principle is depicted in FIG. 4.

Figure 4:
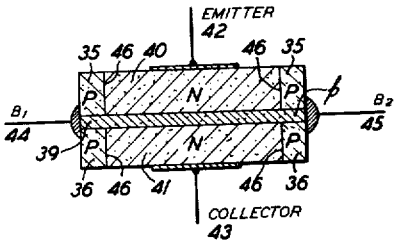
FIG. 4 is a cross-sectional view of an enclosed junction n-p-n tetrode device.

The tetrode device shown in FIG. 4 is essentially the same as that shown in FIG. 1 with P regions 35 and 36 forming continuous bands about the body so that junctions between P region 39 and N regions 40 and 41 do not intersect a surface. Emitter electrode 42, contacting emitter region 40, collector electrode 43, contacting collector region 41, and base electrodes 44 and 45 complete the device. Biasing electrode 45 negative with respect to normal base electrode 44 has the effect of confining electron flow to a portion of p region 39 adjacent base electrode 44, thereby reducing the effective cross-sectional area of p region 39. The device may be be used, for example, in circuits of the type shown in the above-designated patent issued to R. L. Wallace, Jr. in order to perform the functions therein set forth.

The device of FIG. 4 has all of the advantages common to the enclosed junction devices of this invention which are set forth above. In addition, the tetrode device has a much lower base resistance, $r_b$. A further advantage which has been discussed in connection with the description of FIG. 1 is the ease of making effective base electrode connection 44. Making good base contact has been a particular problem in tetrode manufacture which gold alloy wire bonds are made to p layers which are extremely thin, usually about 0.0005 inch or less. To minimize collector and emitter capacitance the area of PN junctions 46 should be as small as is feasible. To further minimize the positive feedback resistance, $r_b$, the height of N regions 40 and 41 as viewed should be small. Power dissipation being dependent upon the cross-sectional areas of junctions 47 and 48, the power handling capacity of the device may be increased by increasing the depth of these junctions as viewed.

Figure 5:
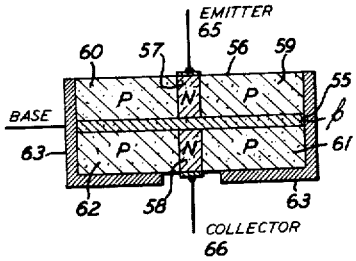
FIG. 5 is a cross-sectional view of yet a different design of enclosed junction device.

FIG. 5 is an example of an enclosed junction device in which the active regions, in being enclosed by inactive regions within the same crystal, are supported by these latter regions and, therefore, are not dependent upon for structural sturdiness. In such a device, therefore, the dimensions of the active regions are limited chiefly by functional considerations. The practical attainment of very small dimensions of the active regions effects a reduction of the magnitudes of certain network parameters such as transistor base resistance, $r_b$, and collector capacitance $C_c$, so that high operating frequencies are obtained.

In the device of FIG. 5, a p layer 55, which may be of a thickness as small as from about 0.001 inch to 0.0001 inch, is created within a block of semiconductor material 56 which may, for example, be about 0.008 inch thick. N regions 57 and 58 are utilized respectively as emitter and collector regions. P regions 59, 60, 61 and 62 together with that portion of p layer 55 not in contact with N regions 57 and 58 provide mechanical support to the very small active regions 57, 58 and 55 and also provide a cooling medium which increases the power dissipation of the device shown. Ring-base connection 63 further minimizes $r_b$. Emitter electrode 65 and collector electrode 66 complete the transistor. Since N regions 57 and 58 are supported in their cross-section by P regions 59, 60, 61 and 62, their cross-sectional diameter may be very small for example, of the order of 0.002 to 0.005 inch.

The device of FIG. 5 may be produced by sweeping an N-producing dot zone vertically by temperature gradient zone-melting through a P-type block 56, thereby producing a thin N-type rod. A p-producing wire-zone is then swept horizontally through the N region, thereby producing a thin p layer 55 and separating the N-type rod into N regions 57 and 58.

In devices such as those of FIGS. 1, 4 and 5, where it is desired to minimize $C_c$, the collector capacitance, the p layer should be near the collector connection so as to reduce the PN area on the collector side of the base. To minimize emitter capacitance, $C_e$, and to maximize gamma the PN area on the emitter side of the base should be small and hence the p layer should be near the emitter connection. Ideally, therefore, the block as a whole should be thin.

Figure 6:
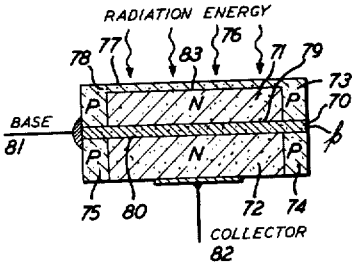
FIG. 6 is a cross-sectional view of a photo-biased internal n-p-n- junction device.

FIG. 6 depicts an enclosed junction phototransducer which comprises p layer 70, N regions 71 and 72 and P regions 73, 74 and 75. Radiation energy 76 strikes surface 77, thereby generating hole-electron pairs which pass through thin portion 78 of P region 73 into N region 71, thereby biasing N region 71 negative with respect to P-p-P region 73, 70, 75, 74 which latter constitutes the base region of the transistor. The forward bias which is transmitted to the entire junction 79 surrounding N region 71 with the speed of electromagnetic effects, that is, essentially instantaneously, causes electron flow from N region 71 to P-p-P region 75, 70, 74. For the reasons described above, most of this current flows across the pN portion of junction 79 and is collected at the pN junction 80. Base and collector electrodes are shown as electrodes 81 and 82.

In FIG. 6, therefore, there is shown a translating device in which photoactivation at one surface of a region produces a bias which instantaneously causes emission of carriers at another surface which may be a considerable distance from the first surface. Thus, a surface photoeffect may be transmitted through, or to, the interior of a body. If the radiation is chosen to have an energy range which is absorbed at or close to the surface and if the PN junction 83 is very close to the same surface, the diffusion time for electrons to be collected and to bias the N region 71 will be short and the frequency response will be improved.

The device of FIG. 6 may be produced by converting all but one surface of a block of N-type conductivity to P-type conductivity by diffusion, arranging it so that the diffusion layer is less than one diffusion-length thickness of the radiation on one surface, but is preferably thicker elsewhere. Thin p layer 70 may be produced by temperature gradient zone-melting.

Figure 7A:
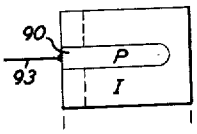
FIGS. 7A, 7B and 7C are top, front and side views respectively, of a p-n junction device in which intrinsic material is interposed between the junctions and the surface of the block.
Figure 7B:
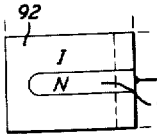
Figure 7C:
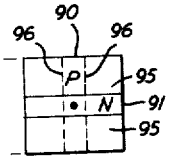

FIGS. 7A, 7B and 7C are plan, elevation and side views respectively of a PN junction device in which no active junction intersects a surface. This device comprises P region 90, N region 91 and enclosing I region 92. Electrode 93, making contact to P region 90, and electrode 94, making contact to N region 91, complete the device. NI junctions 95 and PI junctions 96 intersect the surface of the device. Since the field at the junction of P or N material with intrinsic material is less severe than that at a PN junction because of its larger space-charge region, PI and NI junctions are less susceptible to surface leakage under reverse bias, than is a PN junction.

The device of FIGS. 7A, 7B and 7C is produced by crossed sweeps of line-zones through a block of intrinsic semiconductor. Although in the device shown, N region 91 was produced before P region 90, the order is not significant.

What is claimed is:

1. A semi-conductor translating device comprising a body of semiconductive material, having therein a zone of one conductivity type in contact with a zone of a second conductivity type, in which the junction common to the two said zones is *wholly* enclosed within the said body, together with means for making electrical contact to at least one of the said zones and means for making electrical contact to at least one other portion of the said body.

2. The device of claim 1 in which at least one of the said zones is at least partly enclosed by semiconductive material, having a resistivity for the minority carriers of the said at least one zone, which is different from the resistivity of the material in the said at least one zone.

3. The device of claim 2 in which the said partly enclosing semiconductive material is of intrinsic conductivity.

4. A semiconductor translating device comprising a body of semiconductive material, having therein a zone of first conductivity type between and contiguous with a pair of zones of a second conductivity type, in which the junction area common to the zone of first conductivity type and a zone of second conductivity type is less than the area of the zone of first conductivity type at the surface of the said zone of first conductivity type, adjacent to the said zone of second conductivity type, and in which there is semiconductive material differing in conductivity type from the said zone of second conductivity type and differing in resistivity from the said zone of first conductivity type in contact with the remainder of the surface of the zone of first conductivity type adjacent the said zone of second conductivity type which semiconductive material is also in contact with the said zone of second conductivity type, together with means for making electrical contact to the zone of first conductivity type and at least one of the zones of second conductivity type.

5. The device of claim 4 in which the said semiconductive material, adjacent the remaining surface of said zone of first conductivity type, is of the same conductivity type as the said zone of first conductivity type, and is of a resistivity less than that of the said zone of first conductivity type.

6. The device of claim 4 in which the said semiconductive material adjacent the remaining surface of the said zone of first conductivity type is of intrinsic conductivity.

7. A semiconductor translating device comprising a zone of one conductivity type between and contiguous with a pair of zones of second conductivity type, of lesser cross-section at the area of contiguity, such that the surface of the zone of first conductivity type, which is contiguous with at least one zone of second conductivity type, extends beyond the contiguous surface of the said at least one zone of second conductivity type, and semiconductive material of a conductivity type different from that of the said at least one zone of second conductivity type and of a resistivity different from that of the said zone of first conductivity type, contiguous with and enclosing the entirety of the intersection of the area common to the said zone of first conductivity type, and the said at least one zone of second conductivity type, together with electrical means for making contact to the zone of first conductivity type, and at least one zone of second conductivity type.

8. The device of claim 7 in which the semiconductive material adjacent the intersection of the said area of contact, is of the same conductivity type as the zone of first conductivity type, but is of lesser resistivity.

9. The device of claim 7 in which the said semiconductive material, adjacent the intersection of the said area of contact, is of intrinsic conductivity.

*10. A semiconductor device comprising a crystal having a layer of doped material and at least one layer of intrinsic material, the interface between the intrinsic and doped materials being so interrupted by a p-n junction that the transition zone between the p and n type material is covered by the intrinsic material.*

*11. A semiconductive body selected from the group consisting of germanium and silicon having a p-n junction therein, said junction being covered by a layer of intrinsic material of the same kind as said body.*

*12. A semiconductive body selected from the group consisting of germanium and silicon having a p-n junction therein, said junction being covered by a layer of intrinsic material of the same kind as said body.*

*13. A germanium body having a p-n junction therein, said junction being covered by a layer of intrinsic germanium.*

*14. A silicon body having a p-n junction therein, said junction being covered by a layer of intrinsic silicon.*

*15. A semiconductive device comprising a body of semiconductive material selected from the group consisting of germanium and silicon having a p-n junction therein, a layer of intrinsic material of the same kind as said body covering said junction, and leads electrically attached to said body.*

*16. A semiconductive device comprising a body of germanium having a p-n- junction therein, a layer of in-*

*trinsic germanium covering said junction, and leads electrically attached to said body.*

*17. A semiconductive device comprising a body of silicon having a p-n junction therein, a layer of intrinsic silicon covering said junction, and leads electrically attached to said body.*

*18. A semiconductive body selected from the group consisting of germanium and silicon having regions of different electrical conductivity type material therein, the junction between said regions being covered by a layer of intrinsic material of the same kind as said body.*

*19. A semiconductive body selected from the group consisting of germanium and silicon having adjacent n-type and p-type regions therein, the junction between said regions being covered by a layer of intrinsic material of the same kind as said body.*

*20. A semiconductive body selected from the group*

*consisting of germanium and silicon having adjacent n-type and p-type regions therein, the surface areas of the junction between said regions being covered by a layer of intrinsic material of the same kind as said body.*

References Cited in the file of this patent or the original patent

UNITED STATES PATENTS

| | | |
|---|---|---|
| 2,502,479 | Pearson et al. | Apr. 4, 1950 |
| 2,504,628 | Benzer | Apr. 18, 1950 |
| 2,569,347 | Shockley | Sept. 25, 1951 |
| 2,644,852 | Dunlap | July 7, 1953 |
| 2,666,814 | Shockley | Jan. 19, 1954 |
| 2,672,528 | Shockley | Mar. 16, 1954 |
| 2,695,852 | Sparks | Nov. 30, 1954 |
| 2,697,052 | Dacy et al. | Dec. 14, 1954 |
| 2,732,519 | Freedman | Jan. 24, 1956 |